United States Patent
Kim et al.

(10) Patent No.: US 7,982,231 B2
(45) Date of Patent: *Jul. 19, 2011

(54) SILICON-BASED LIGHT EMITTING DIODE USING SIDE REFLECTING MIRROR

(75) Inventors: Tae-Youb Kim, Seoul (KR); Nae-Man Park, Daejeon (KR); Gun-Yong Sung, Daejeon (KR); Jong-Heon Yang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 183 days.

This patent is subject to a terminal disclaimer.

(21) Appl. No.: 12/096,751

(22) PCT Filed: Apr. 25, 2006

(86) PCT No.: PCT/KR2006/001540
§ 371 (c)(1),
(2), (4) Date: Jun. 9, 2008

(87) PCT Pub. No.: WO2007/066857
PCT Pub. Date: Jun. 14, 2007

(65) Prior Publication Data
US 2008/0290360 A1 Nov. 27, 2008

(30) Foreign Application Priority Data
Dec. 8, 2005 (KR) .......... 10-2005-0119289
Feb. 15, 2006 (KR) .......... 10-2006-0014683

(51) Int. Cl.
*H01L 33/00* (2010.01)
(52) U.S. Cl. ...... 257/98; 257/99; 257/100; 257/E33.059
(58) Field of Classification Search ............. 257/98–100
See application file for complete search history.

(56) References Cited

U.S. PATENT DOCUMENTS

| | | | |
|---|---|---|---|
| 5,003,357 A * | 3/1991 | Kim et al. ...................... | 257/98 |
| 6,661,035 B2 * | 12/2003 | Negro et al. .................. | 257/105 |
| 2006/0157730 A1 * | 7/2006 | Otsuka et al. ................. | 257/103 |

* cited by examiner

*Primary Examiner* — Samuel A Gebremariam
(74) *Attorney, Agent, or Firm* — Rabin & Berdo, P.C.

(57) ABSTRACT

A silicon light emitting diode capable of effectively utilizing light radiated toward the lateral side of a substrate by including a side reflecting mirror is provided. The silicon-based light emitting diode includes a p-type silicon substrate having a plurality of grooves, a light emitting diode layer formed on each of the grooves of the silicon substrate, the light emitting diode layer including an active layer, an n-type doped layer, and a transparent electrode layer, and a metal electrode including a lower metal electrode formed on the bottom surface of the p-type silicon substrate and an upper metal electrode formed on the top surface of the transparent electrode layer. The lateral surface of each of the grooves is separated from the light emitting diode layer and used as a reflecting mirror. The lateral surface is referred to as the side reflecting mirror.

11 Claims, 3 Drawing Sheets

SILICON-BASED LIGHT EMITTING DIODE USING SIDE REFLECTING MIRROR

TECHNICAL FIELD

The present invention relates to a silicon semiconductor device, and more particularly, to a silicon-based light emitting diode having an improved structure to improve luminous efficiency.

BACKGROUND ART

Silicon-based light emitting diodes, for example, near infrared, visible, and ultraviolet light emitting diodes using silicon nano-size dots, have new structures to overcome the limits of a conventional silicon semiconductor that provides low luminous efficiency due to indirect transition. Silicon-based light emitting diodes are compatible with other silicon-based photoelectronic devices and manufactured with low costs. Hence, many researches into silicon-based light emitting diodes have been made. However, because silicon-based light emitting diodes still provide low luminous efficiency, it is difficult to apply the silicon-based light emitting diodes to electronic apparatuses, etc., and many improvements are needed.

The formation and characteristics of a crystalline silicon nano-size dot usually used in silicon-based light emitting diodes are disclosed in Appl. Phys. Lett. 85, 5355 2004. The structure and radiation characteristics of silicon-based light emitting diodes are disclosed in Appl. Phys. Lett. 86, 071909 2005.

One of the essential causes of a degradation of the luminous efficiency of silicon-based light emitting diodes is that all emitted light cannot be utilized overall. In other words, silicon-based light emitting diodes using silicon nano-size dots use a silicon substrate and accordingly utilize only light heading for the upper surface of the silicon substrate among lights emitted in all directions. In other words, light heading for the lateral surfaces of the silicon substrate are not used and lost. Therefore, silicon-based light emitting diodes provide relatively lower luminous efficiency than compound semiconductor light emitting diodes.

DISCLOSURE OF INVENTION

Technical Problem

The present invention provides a silicon light emitting diode capable of effectively utilizing light radiated toward the lateral side of a substrate by including a side reflecting mirror.

Technical Solution

According to an aspect of the present invention, there is provided a silicon-based light emitting diode using a side reflecting mirror, the silicon-based light emitting diode including: a p-type silicon substrate having a plurality of grooves; a light emitting diode layer formed on each of the grooves of the silicon substrate, the light emitting diode layer including an active layer, an n-type doped layer, and a transparent electrode layer; and a metal electrode including a lower metal electrode formed on the bottom surface of the p-type silicon substrate and an upper metal electrode formed on the top surface of the transparent electrode layer. A lateral surface of each of the grooves is separated from the light emitting diode layer and used as a reflecting mirror, and the lateral surface is referred to as the side reflecting mirror.

The lateral surface of each of the grooves has an inclination with respect to the bottom surface of each of the grooves by anisotropic-wet-etching the p-type silicon substrate. The inclination is about 10°-80°.

The n-type doped layer and the transparent electrode layer are placed on the active layer. The upper metal electrode formed on the transparent electrode layer has a shape of a ring. The n-type doped layer may be formed of an n-type compound semi-conductor or an n-type silicon semiconductor. 10. The active layer may be formed of crystalline silicon nano-size dots or amorphous silicon nano-size dots.

The bottom surface of each groove is circular, elliptical, or rectangular. When the bottom surface is circular, its diameter is about 0.01 to 10 mm, and the depth of the groove from the top surface of the silicon substrate is about 0.1 to 10 mm.

The light emitting diode layer may have a shape of a pillar whose cross-section is identical with the shape of the bottom surface of the groove. The thickness of the light emitting diode layer may be smaller than or equal to the depth of the groove. Accordingly, the inclined surface of the groove may surround the light emitting diode layer. In particular, the active layer of the light emitting diode layer may be formed within the groove so that light heading for the inclined surface of the groove among the light emitted from the active layer can be reflected by the inclined surface of the groove.

The silicon light emitting diode does not limit a light emission area only to the top surface of the substrate on which the transparent electrode layer is formed but broadens the light emission area even to the inclined surface of the groove of the silicon substrate. In other words, the silicon light emitting diode condenses light lost through the lateral side of the silicon substrate toward the top surface of the substrate, thereby improving the luminous efficiency.

Advantageous Effects

As described above, a silicon-based light emitting diode according to the present invention uses silicon nano-size dots as an active layer. A silicon side reflecting mirror is formed as the inner lateral side of a substrate using the existing silicon wet-etching process. Accordingly, light radiated toward the inner lateral side of the substrate can be effectively utilized without being lost, and thus the luminous efficiency of the light emitting diode is improved.

Moreover, the silicon-based light emitting diode is simply manufactured. Therefore, the silicon-based light emitting diode has stable operational characteristics and improved electroluminescence characteristics.

DESCRIPTION OF DRAWINGS

The above and other features and advantages of the present invention will become more apparent by describing in detail exemplary embodiments thereof with reference to the attached drawings in which.

BEST MODE

Figure 1:
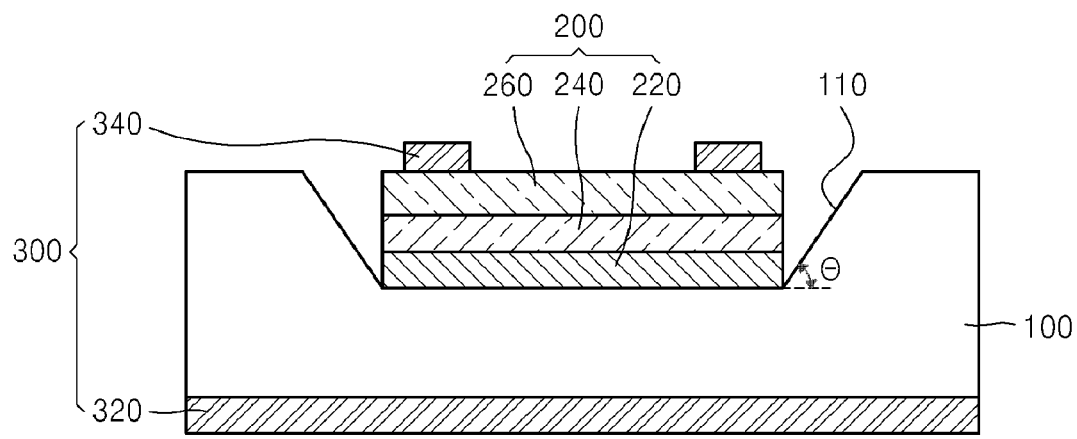
FIG. 1 is a cross-section of a silicon-based light emitting diode using a side reflecting mirror according to an embodiment of the present invention.

The present invention will now be described more fully with reference to the accompanying drawings, in which exemplary embodiments of the invention are shown. It will be understood that when an element is referred to as being 'on' another element, it can be directly on the other element, or intervening elements may also be present. In the drawings, the thicknesses or sizes of elements are exaggerated for clarity, and like reference numerals denote like elements. Terminology used herein is not used to limit the scope of the present invention as defined by the accompanying claims but to describe the present invention.

An improvement of the performance of a light emitting device depends upon an active layer that produces light, a doped layer into which carriers are injected, a reflection layer that effectively emits light, and a configuration of these layers. In particular, silicon-based light emitting diodes using silicon nano-size dots provide weaker self-illumination than compound semiconductor light-emitting diodes. Thus, an effective configuration of the aforementioned layers is more important in silicon-based light emitting diodes using silicon nano-size dots.

FIG. 1 is a cross-section of a silicon-based light emitting diode using a side reflecting mirror according to an embodiment of the present invention. Referring to FIG. 1, the silicon-based light emitting diode includes a substrate 100 having a plurality of grooves, a light emitting diode 200 formed on each of the grooves of the substrate 100, and a metal electrode 300. Lateral surfaces 110 of each of the grooves formed on the substrate 100 have a certain inclination θ with respect to the bottom surface of the groove.

The substrate 100 is a p-type silicon substrate, and the bottom surface of the groove is formed of a p-type doped layer so as to inject a carrier into the light emitting diode layer 200. The slant lateral surfaces 110 of the grooves reflect light emitted from the light emitting diode layer 200 to the upper surface of the substrate 100. The inclination (θ) of each of the lateral surfaces 110 of the grooves is less than 90°. Generally, the inclination (θ) is about 10°~80°, preferably, about 40°~60°.

The light emitting diode layer 200 includes an active layer 220 in which light emission occurs, an n-type doped layer 240 formed on the active layer 220, and a transparent electrode layer 260 formed on the n-type doped layer 240.

The active layer 220 may be formed of crystalline silicon nano-size dots or amorphous silicon nano-size dots. The thickness of the active layer 220 is preferably about 10 nm~100 □.

The n-type doped layer 240 is formed of an n-type compound semiconductor or an n-type silicon semiconductor. Generally, the n-type doped layer 240 is formed by doping silicon carbon (SixC1-x,0≦x≦1) or silicon carbon nitride (SiCxN1-x,0≦x≦1) with n-type dopant. Of course, the n-type doped layer 240 should be a transparent layer because the light emitted from the active layer 220 should head toward the top surface of the substrate 100. The n-type doped layer 240 may use a phosphorus (P)-based dopant. The doping concentration is about $10^{16}$~$10^{19}$ □, and the thickness of the n-type doped layer 240 is about 1~4 □. However, the doping concentration or thickness may vary according to the characteristics or structure of the silicon-based light emitting diode.

The transparent electrode layer 260 is formed of a conductive transparent material, such as ITO, IZO, ZnO, or $In_2O_3$ preferably, ITO.

The metal electrode 300 includes a lower metal electrode 320 formed on the bottom surface of the substrate 100 and an upper metal electrode 340 formed on the top surface of the transparent electrode layer 260 of the light emitting diode layer 200. The metal electrode 300 applies a voltage to the light emitting diode layer 200 so that carriers move toward the active layer 220.

The silicon-based light emitting diode of FIG. 1 reflects light heading for the lateral side of the active layer 220 among the light generated by the active layer 220 to the top surface of the substrate 100 by using the lateral surface 110 of the grooves, thereby improving the luminous efficiency. Therefore, the lateral surface 110 of each groove formed of silicon functions as a reflection mirror. Thus, the lateral surface 110 is called a side reflecting mirror.

Figure 2:
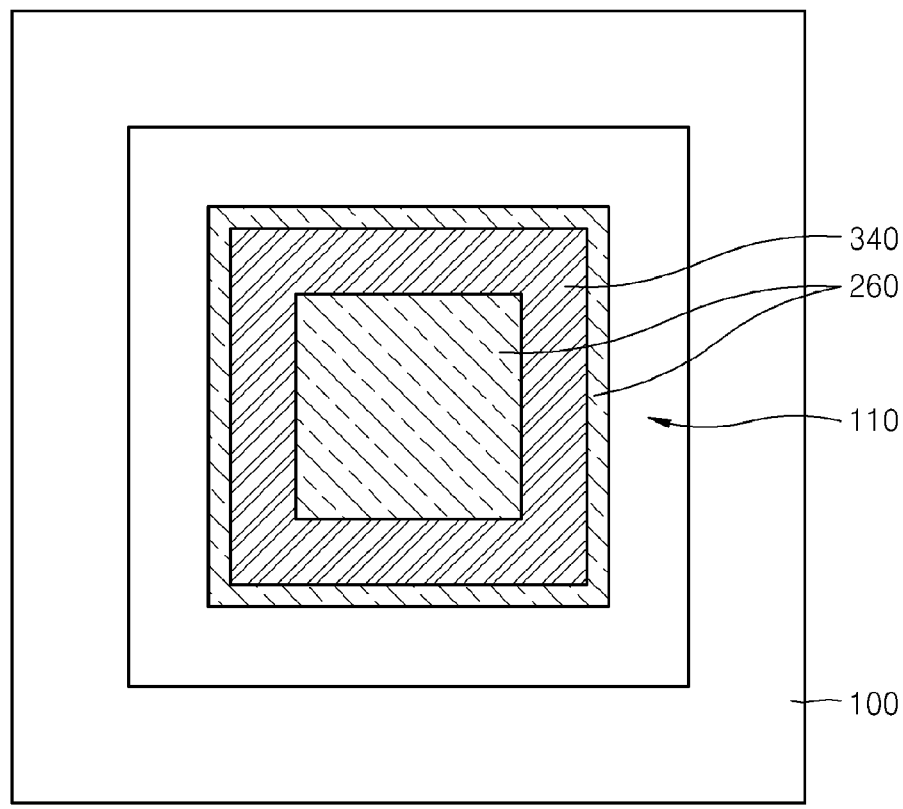
FIG. 2 is a plan view of the silicon-based light emitting diode of FIG. 1.

FIG. 2 is a plan view of the silicon-based light emitting diode of FIG. 1. Referring to FIG. 2, the side reflecting mirror 110 and the transparent electrode layer 260 are shown inward the substrate 100. An upper metal electrode 340 having a rectangular ring shape is shown inward the transparent electrode layer 260.

In the present embodiment, the bottom surface of the groove is rectangular, and the light emitting diode layer 200 is formed in a pillar shape with a rectangular cross-section so as to accord with the bottom surface of the groove. It is preferable that the horizontal cross-section of the light emitting diode layer 200 or the rectangular bottom surface of the groove is designed so that the length of one side is about 0.01-10 mm, but the present invention is not limited to this value. As described above, the light emitting diode layer 200 is surrounded by the side reflecting mirror 110, and the light emitted from the active layer 220 toward the lateral surface of the groove is reflected by the side reflecting mirror 110 and heads for the top surface of the substrate 100.

The upper metal electrode 340 formed on the transparent electrode layer 260 has a shape of a rectangular ring that is formed on the edges of the transparent electrode layer 260, but the present invention is not limited to this shape. In other words, the upper metal electrode 340 may be formed in the other various rings, such as, a circular ring or an elliptical ring. The reason why the upper metal electrode 340 is formed in the ring shape is that a voltage can be more evenly applied to the transparent electrode layer 260.

Figure 3:
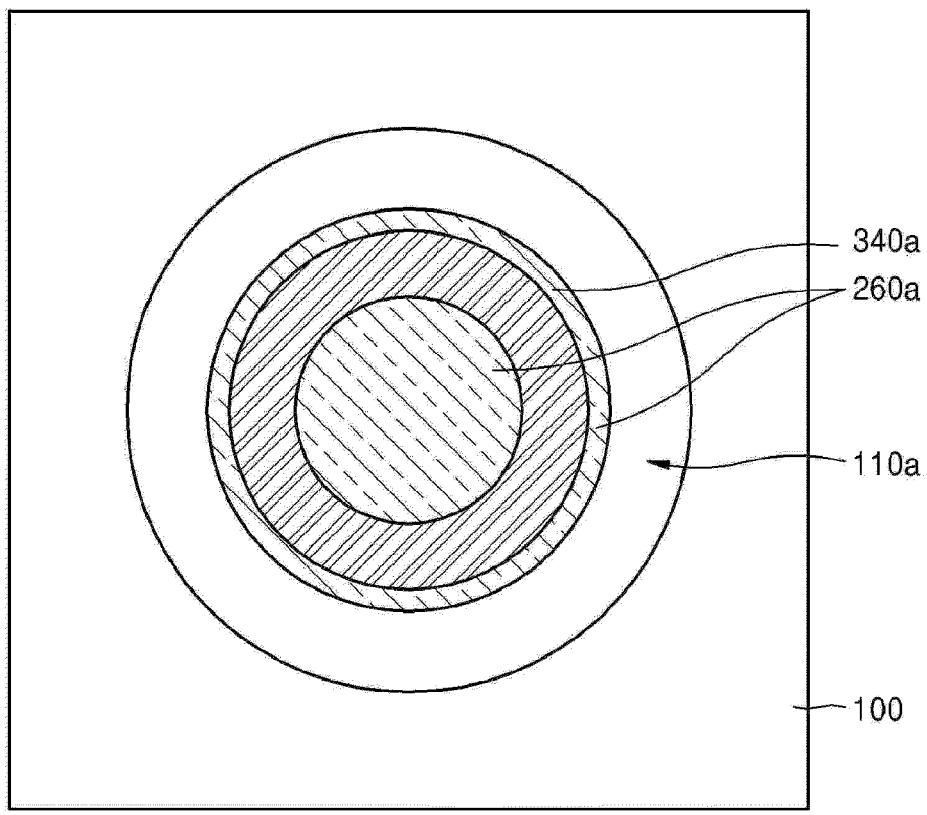
FIG. 3 is a plan view of a silicon-based light emitting diode using a side reflecting mirror according to another embodiment of the present invention.

FIG. 3 is a plan view of a silicon-based light emitting diode using a side reflecting mirror 110a according to another embodiment of the present invention. Referring to FIG. 3, the side reflecting mirror 110a, a transparent electrode layer 260a, and an upper metal electrode 340a are formed in circular shapes in contrast with the embodiment of FIG. 2. Although not illustrated, in the present embodiment, a light emitting diode layer including the transparent electrode layer 260a is formed in a cylindrical shape. The cross-section of the light emitting diode layer or the diameter of the circular bottom surface of the groove is properly about 0.01-10 mm, but the present invention is not limited to this value.

Although light emitting diode layers having a rectangular block shape and a cylinder shape are illustrated in the two embodiments, they may have an elliptical cylinder shape or the other various shapes of prisms. In addition, the cross-sections of the upper metal electrodes 340 and 340a and the side reflecting mirrors 110 and 110a preferably have circular or rectangular ring shapes to accord with the horizontal cross-section of the light emitting diode layer. However, the cross-sections of the upper metal electrodes 340 and 340a and the side reflecting mirrors 110 and 110a are not limited to these shapes but may have the other various shapes of rings.

Figure 4A:
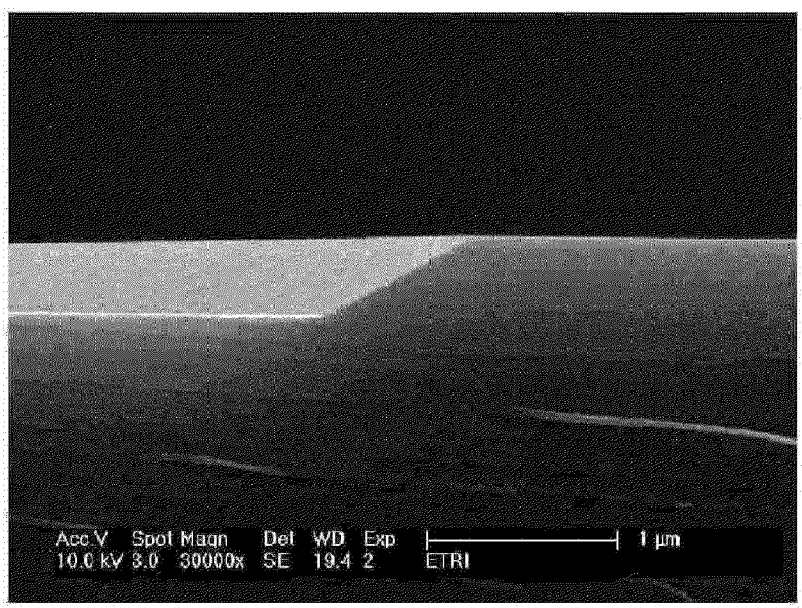
FIGS. 4A and 4B are scanning electron microscope (SEM) pictures of a side reflecting mirror of a silicon-based light emitting diode according to the present invention.
Figure 4B:

FIGS. 4A and 4B are scanning electron microscope (SEM) pictures of a side reflecting mirror of a silicon-based light emitting diode according to the present invention. A side reflecting mirror is illustrated at the center of the left side of FIG. 4A. FIG. 4B is a picture showing more the upper surface of a substrate than the picture of FIG. 4A. Referring to FIG. 4, a portion descending from the upper left corner toward the center is the side reflecting mirror.

The inner inclined lateral side, that is, the side reflecting mirror, may be formed in the silicon substrate by anisotropic wet etching. The silicon substrate may have a (100) oriented silicon crystal plane. For example, the side reflecting mirror illustrated in FIGS. 4A and 4B may be manufactured by wet-etching a p-type silicon substrate having a (100) oriented silicon crystal plane using a AZ500MIF solution which is used in PR patterning.

Figure 5:
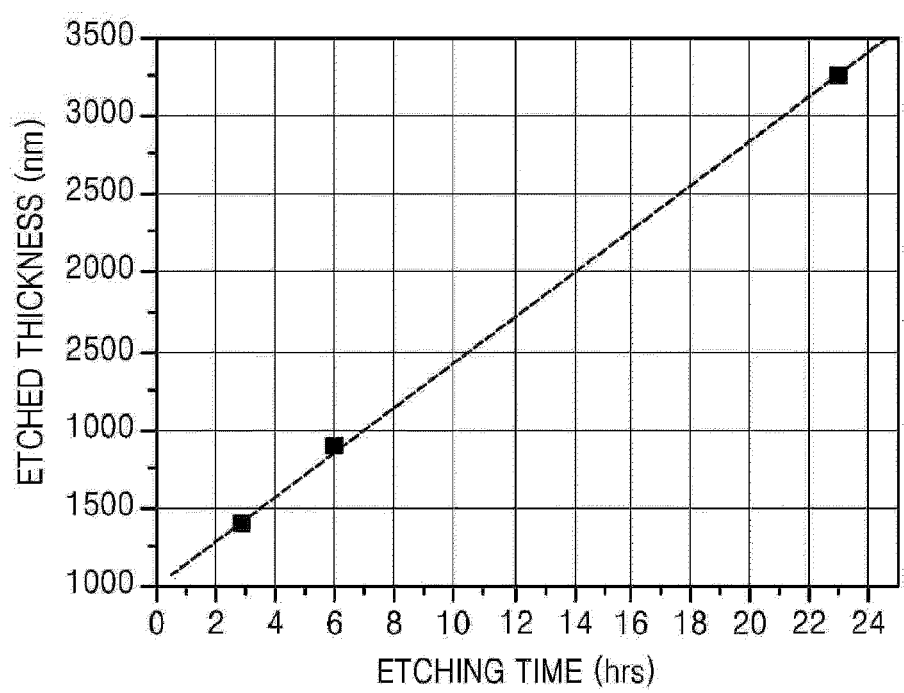
FIG. 5 is a graph showing the rate at which a substrate having a (100) oriented silicon crystal plane is etched by an AZ500MIF solution as an etch solution during formation of a silicon side reflecting mirror of a silicon-based light emitting diode according to the present invention.

FIG. 5 is a graph showing the rate at which a substrate having a (100) oriented silicon crystal plane is etched by the AZ500MIF solution as an etch solution during formation of a silicon side reflecting mirror of the silicon-based light emitting diode according to the present invention. Referring to FIG. 5, the horizontal axis indicates the etching time (unit is hour), and the vertical axis indicates the etched thickness (whose unit is nanometer (□)). In FIG. 5, small black rectangles denote lattice points on a (100) oriented crystal plane. The dotted straight line may be obtained using a linear fitting technique to which a least square method or the like is applied. According to a calculation in units of minute using the dotted straight line, the etch rate is about 2.39 □/min.

In the light emitting diodes according to the above-described embodiment, when current is applied to the metal electrode 300, carriers consisting of electrons or holes pass through the transparent electrodes 260 and 260a and the n-type doped layer 240, and thus light is generated by the active layer 220. The generated light does not radiate only toward the upper surface of the substrate 100 but radiates in all directions. However, light emitted toward the inner inclined surface of the substrate 100 can be reflected by the side reflecting mirrors 110 and 110a toward the upper surface of the substrate 100. Hence, the luminous efficiency of the light emitting devices can be effectively improved.

In addition, the side reflecting mirrors 110 and 110a can be easily formed using an existing anisotropic etching process in which the AZ500MIF solution is used as an etching solution. The easy formation of the side reflecting mirrors helps the light emitting devices to have stable operational characteristics. Thus, the light emitting diodes have improved electroluminescence characteristics.

As described above, a silicon-based light emitting diode according to the present invention uses silicon nano-size dots as an active layer. A silicon side reflecting mirror is formed as the inner lateral side of a substrate using the existing silicon wet-etching process. Accordingly, light radiated toward the inner lateral side of the substrate can be effectively utilized without being lost, and thus the luminous efficiency of the light emitting diode is improved.

Moreover, the silicon-based light emitting diode is simply manufactured. Therefore, the silicon-based light emitting diode has stable operational characteristics and improved electroluminescence characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

The present invention relates to a silicon semiconductor device, and more particularly, to a silicon-based light emitting diode having an improved structure to improve luminous efficiency. The silicon-based light emitting diode according to the present invention is simply manufactured. Therefore, the silicon-based light emitting diode has stable operational characteristics and improved electroluminescence characteristics.

The invention claimed is:

1. A silicon-based light emitting diode using a side reflecting mirror, comprising:
  a p-type silicon substrate having a plurality of grooves;
  a light emitting diode layer formed on each of the grooves of the silicon substrate, the light emitting diode layer including an active layer, an n-type doped layer, and a transparent electrode layer; and
  a metal electrode including a lower metal electrode formed on the bottom surface of the p-type silicon substrate and an upper metal electrode formed on the top surface of the transparent electrode layer,
  wherein a lateral surface of each of the grooves is separated from the light emitting diode layer and used as a reflecting mirror, and the lateral surface is referred to as the side reflecting mirror, and
  wherein the active layer is formed of one of crystalline silicon nano-size dots and amorphous silicon nano-size dots,
  wherein:
  the n-type doped layer and the transparent electrode layer are sequentially formed on the active layer; and
  the upper metal electrode formed on the transparent electrode layer has a shape of a ring that is formed on the edges of the transparent electrode layer when viewed in plan view.

2. The silicon-based light emitting diode of claim 1, wherein:
  the light emitting diode layer has a shape of one of a cylinder, an elliptical cylinder, and a rectangular block; and
  the upper metal electrode has a shape of one of a circular ring, an elliptical ring, and a rectangular ring.

3. A silicon-based light emitting diode using a side reflecting mirror, comprising:
  a p-type silicon substrate having a plurality of grooves;
  a light emitting diode layer formed on each of the grooves of the silicon substrate, the light emitting diode layer including an active layer, an n-type doped layer, and a transparent electrode layer, the active layer being in direct physical contact with a bottom of each of the grooves; and
  a metal electrode including a lower metal electrode formed on the bottom surface of the p-type silicon substrate and an upper metal electrode formed on the top surface of the transparent electrode layer,
  wherein a lateral surface of each of the grooves is separated from the light emitting diode layer and used as a reflecting mirror, and the lateral surface is referred to as the side reflecting mirror, and
  wherein the active layer is formed of one of crystalline silicon nano-size dots and amorphous silicon nano-size dots.

4. The silicon-based light emitting diode of claim 1, wherein the thickness of the active layer is 10 nm to 100 μm.

5. The silicon-based light emitting diode of claim 1, wherein the n-type doped layer is formed of one of an n-type compound semiconductor and an n-type silicon semiconductor.

6. The silicon-based light emitting diode of claim 1, wherein:
the lateral surface of each groove is inclined with respect to a bottom surface of the groove; and
the inclination of the lateral surface is less than 90°.

7. The silicon-based light emitting diode of claim 6, wherein:
the silicon substrate has a (100) oriented silicon crystal plane; and
the inclination is obtained by anisotropic-wet-etching the silicon substrate.

8. The silicon-based light emitting diode of claim 7, wherein:
the anisotropic-wet-etching method uses an AZ500MIF solution; and
the lateral surface of the groove is 10°-80° inclined with respect to the bottom surface of the groove.

9. The silicon-based light emitting diode of claim 1, wherein:
the bottom surface of the groove is circular, elliptical, or rectangular; and
the depth of the groove from the top surface of the silicon substrate is 0.1 to 10 mM.

10. The silicon-based light emitting diode of claim 9, wherein:
the bottom surface of the groove is circular; and
a diameter of the bottom surface of the groove is 0.01 to 10 mm.

11. The silicon-based light emitting diode of claim 9, wherein:
the light emitting diode layer has a shape of a pillar whose cross-section is identical with the shape of the bottom surface of the groove; and
the thickness of the light emitting diode layer is no more than the depth of the groove.

* * * * *